(12) United States Patent
Sasaki et al.

(10) Patent No.: US 7,502,433 B1
(45) Date of Patent: Mar. 10, 2009

(54) BIMODAL SOURCE SYNCHRONOUS INTERFACE

(75) Inventors: Paul T. Sasaki, Sunnyvale, CA (US); Jason R. Bergendahl, Sunnyvale, CA (US)

(73) Assignee: XILINX, Inc., San Jose, CA (US)

( * ) Notice: Subject to any disclaimer, the term of this patent is extended or adjusted under 35 U.S.C. 154(b) by 900 days.

(21) Appl. No.: 10/919,766

(22) Filed: Aug. 17, 2004

(51) Int. Cl.
*H04L 7/00* (2006.01)
*G06F 1/12* (2006.01)
*G06F 13/42* (2006.01)
*H03L 7/00* (2006.01)

(52) U.S. Cl. .................... 375/356; 375/354; 713/400; 327/141

(58) Field of Classification Search .................. 375/354; 714/12; 358/409
See application file for complete search history.

(56) References Cited

U.S. PATENT DOCUMENTS

| | | | |
|---|---|---|---|
| 3,750,021 A | 7/1973 | Lender | |
| 3,823,397 A | 7/1974 | Howard et al. | |
| 3,863,226 A | 1/1975 | Ryburn | |
| 4,688,016 A | 8/1987 | Fok | |
| 5,038,365 A | 8/1991 | Belloc et al. | |
| 5,144,304 A | 9/1992 | McMahon et al. | |
| 6,282,210 B1 * | 8/2001 | Rapport et al. | 370/518 |
| 6,411,301 B1 * | 6/2002 | Parikh et al. | 345/522 |
| 6,459,393 B1 | 10/2002 | Nordman | |
| 6,542,096 B2 | 4/2003 | Chan et al. | |
| 6,671,787 B2 | 12/2003 | Kanda et al. | |
| 6,696,995 B1 | 2/2004 | Foley et al. | |
| 6,707,399 B1 | 3/2004 | Wang et al. | |
| 6,724,328 B1 | 4/2004 | Lui et al. | |
| 6,816,095 B1 | 11/2004 | Yokoyama et al. | |
| 6,947,470 B2 * | 9/2005 | Berens | 375/144 |
| 7,187,200 B2 | 3/2007 | Young | |
| 7,218,137 B2 | 5/2007 | Vadi et al. | |
| 2003/0193894 A1 | 10/2003 | Tucker et al. | |
| 2004/0136409 A1 * | 7/2004 | Robinett et al. | 370/535 |

(Continued)

OTHER PUBLICATIONS

Altera, Corp., "ODR SRAM Controller Reference Design for Stratix and Stratix GS Devices", Application Note 211, Nov. 2002, pp. 1-30, v. 2.0, available from Altera Corporation, 2610 Orchard Parkway, San Jose, California 95134-2020.

(Continued)

*Primary Examiner*—David C Payne
*Assistant Examiner*—Brian J Stevens
(74) *Attorney, Agent, or Firm*—W. Eric Webostad; Justin Liu

(57) ABSTRACT

Method and apparatus for a bimodal source synchronous interface for a receiver module is described. A first input cell with a first delay chain and a first register block is provided for receipt of a forwarded clock signal by the first delay chain. A second input cell with a second delay chain and a second register block is provided for receipt of a data signal by the second delay chain. The second input cell is configured such that output from the second delay chain is coupled to a data input of the second register block. The first input cell and the second input cell may be operated in either a first modality or a second modality. The first modality may be for interfacing to a synchronous integrated circuit interface. The second modality may be for interfacing to a synchronous network/telecommunications interface.

20 Claims, 12 Drawing Sheets

U.S. PATENT DOCUMENTS

| | | | |
|---|---|---|---|
| 2004/0243899 A1 | 12/2004 | Bonneau et al. | |
| 2005/0007154 A1* | 1/2005 | Patella et al. | 327/2 |
| 2005/0134332 A1* | 6/2005 | Wang et al. | 327/108 |
| 2005/0218937 A1* | 10/2005 | Johnson et al. | 327/2 |
| 2005/0286567 A1* | 12/2005 | Cherukuri et al. | 370/507 |

OTHER PUBLICATIONS

Altera, Corp., "The Benefits of Altera's High-Speed DDR SDRAM memory Interface Solution", White Paper, May 2004, pp. 1-16, v. 1.1 available from Altera Coporation, 2610 Orchard Parkway, San Jose, California 95134-2020.

Altera, Corp., "DDR SDRAM Controller MegaCore Function User Guide", Feb. 2003, pp. 1-89, Core Version 1.1.0, Document Version 1.1.0 rev 1, available from Altera Coporation, 2610 Orchard Parkway, San Jose, California 95134-2020.

Altera, Corp., "Using High-Speed Differential I/O Interfaces in Stratix Devices", Application Note 202, Jan. 2003, pp. 1-72, v. 2.1, available from Altera Corporation, 2610 Orchard Parkway, San Jose, California 95134-2020.

Altera, Corp., "Using Source-Synchronous Signaling with DPA in Stratix GX Devices", Application Note 236, Nov. 2002, pp. 1-18, v. 1.0, available from Altera Corporation, 2610 Orchard Parkway, San Jose, California 95134-2020.

Altera, Corp., "Section 1. Device Pine Information", Jul. 2003, Ch. 1-7, pp. 1-1 to 7-84, v. 2.0, available from Altera Corporation, 2610 Orchard Parkway, San Jose, California 95134-2020.

Altera, Corp., "Section II. Memory", Apr. 2004, Ch. 2-3, pp. II-1 to 3-28, v. 3.0, available from Altera Corporation, 2610 Orchard Parkway, San Jose, California 95134-2020.

Altera, Corp., "Section III. I/O Standards", Apr. 2004, Ch. 4-5, pp. III-1 to 5-76, v. 3.0 available from Altera Corporation, 2610 Orchard Parkway, San Jose, California 95134-2020.

Altera, Corp., "Section VI. Configuration & Remote System Upgrades", Apr. 2004, Ch. 11-12, pp. VI-1 to 12-44, available from Altera Corporation, 2610 Orchard Parkway, San Jose, California 95134-2020.

Altera, Corp., "2. TriMatrix Embedded Memory Blocks in Stratix & Stratix GX Devices", Apr. 2004, pp. 2-1 to 2-28, v. 3.0, available from Altera Corporation, 2610 Orchard Parkway, San Jose, California 95134-2020.

Altera, Corp., "3. External Memory Interfaces", Apr. 2004, pp. 3-1 to 3-28, v. 3.0, available from Altera Corporation, 2610 Orchard Parkway, San Jose, California 95134-2020.

Altera, Corp., "4. Selectable I/O Standards in Stratix & Stratix GX Devices", Apr. 2004, pp. 4-1 to 4-42, vol. 2, v. 3.0, available from Altera Corporation, 2610 Orchard Parkway, San Jose, California 95134-2020.

Altera, Corp., "5. High-Speed Differential I/O Interfaces in Stratix Devices", Apr. 2004, pp. 5-1 to 5-76, vol. 2, v. 3.0, available from Altera Corporation, 2610 Orchard Parkway, San Jose, California 95134-2020.

Altera, Corp., "Section I. Clock Management", Apr. 2004, pp. 1-1 to 1-58, vol. 2, v. 3.0, available from Altera Corporation, 2610 Orchard Parkway, San Jose, California 95134-2020.

Altera, Corp., "Section I. Stratix Device Family Data Sheet", Apr. 2004, Ch. 1-5, pp. 1-1 to 5-2, vol. 1, available from Altera Corporation, 2610 Orchard Parkway, San Jose, California 95134-2020.

Altera, Corp., "Section II. PCB Layout Guidelines", Apr. 2003, Ch. 8-10, pp. II-1 to 10-58, vol. 1, available from Altera Corporation, 2610 Orchard Parkway, San Jose, California 95134-2020.

U.S. Appl. No. 10/889,553, Zhang et al., filed Jul. 12, 2004.
U.S. Appl. No. 10/889,248, Zhang et al., filed Jul. 12, 2004.
U.S. Appl. No. 10/919,900, Sasaki et al., filed Aug. 17, 2004.
U.S. Appl. No. 10/919,901, Sasaki et al., filed Aug. 17, 2004.

* cited by examiner

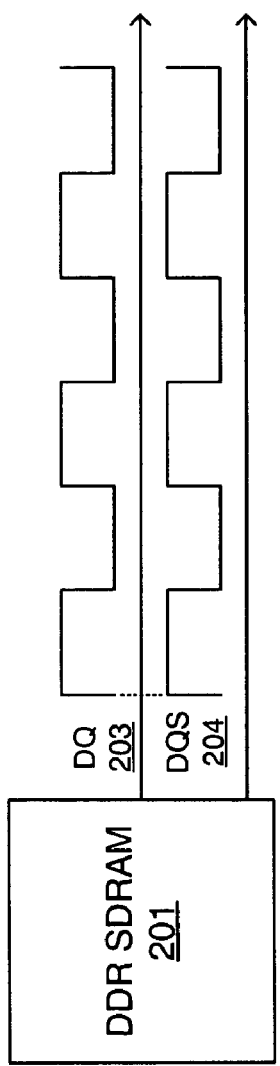
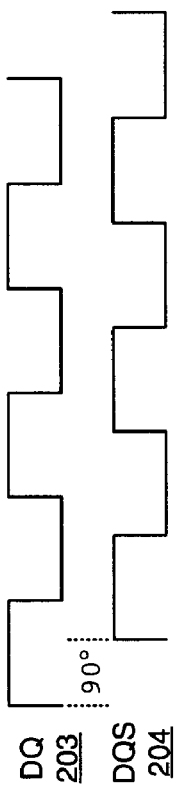
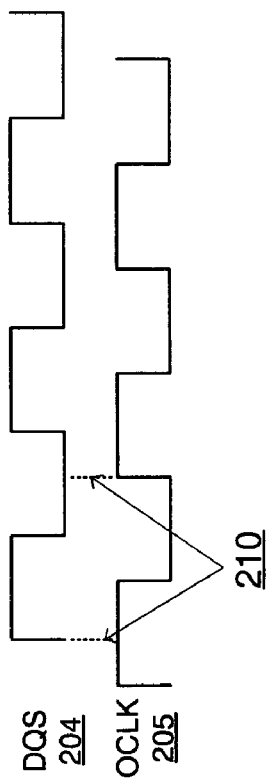
FIG. 2A
FIG. 2B
FIG. 2C

BIMODAL SOURCE SYNCHRONOUS INTERFACE

FIELD OF THE INVENTION

One or more aspects of the invention relate generally to a source synchronous interface and more particularly, to a source synchronous interface that may be configured for operation in one of two modes.

BACKGROUND OF THE INVENTION

Digital communication of information from a source to a receiver may be done source synchronously. Source synchronous communication involves a clock signal from the source ("source clock signal" or "forwarded clock signal") being sent in parallel with other information from the source. Such other information may include data or control information, where control information includes address information. Hereinafter, such information is referred to as data, which includes one or more of data and control information.

There are different types of source synchronous communication, which may depend on the application. For example, in source synchronous communication between locally co-located integrated circuits, frequency of the source clock signal from a source integrated circuit may be known a priori by a receiving integrated circuit. An example of this type of source synchronous interface may be found in communication with synchronous memory, where a forwarded clock signal is sent in parallel with a data signal.

However, for example, in source synchronous communication in computer networks or telecommunications interfaces, such as between a transmitting device and a receiving device, frequency of a source clock signal may not be known by the receiving device. Furthermore, due to differences in signal propagation delays, there may be skew between information communicated in parallel with the source clock signal. For example, data on one channel may be askew from data on another channel.

For memory interfacing, and for some network interfacing, frequency of the forwarded clock signal and the frequency of the receiver integrated circuit interface are the same, though with the possibility of phase mismatch. In these same frequency applications, there were several conventional circuits used. One conventional circuit uses a first-in, first-out buffer ("FIFO"). A forwarded clock signal was used to clock in data into the FIFO, and a receiver internal clock was used to clock out the data from the FIFO. A delay-locked loop ("DLL") or phase-locked loop ("PLL") was used in another conventional circuit to generate a phase-shifted clock signal to account for phase mismatch with the forwarded clock signal and an internal receiver clock signal. In yet another conventional circuit, printed circuit board trace lengths were designed to avoid phase mismatch between the forwarded clock signal and the internal receiver clock signal. However, using a FIFO or a DLL/PLL adds a significant amount of circuitry, and though tailored trace lengths do not necessarily add circuitry, they tend to be inflexible to changes in environment or operation, and tend to be difficult to implement.

More particular with respect to interfacing to a synchronous memory, since the frequencies of the forwarded clock and the receiver clock are the same, it is possible to do a number of computations using data from the source, receiver and the printed circuit board layout to compute a phase difference. The issue with this computation is that it has a large amount of uncertainty due to process, voltage and temperature variations of the source and the receiver. The variation of delays due to the printed circuit board is insignificant by comparison. The uncertainty greatly limits the highest frequency at which one can operate due to the possibility that source and receiver clocks have a window of coincidence. Notably, this uncertainty is not greatly reduced for faster devices. This uncertainty limits interface performance, and it may not be worthwhile to employ faster devices without adding a FIFO.

Accordingly, it would be desirable and useful to provide a source synchronous interface that avoids one or more of the above-mentioned limitations.

SUMMARY OF THE INVENTION

An aspect of the invention is a method for providing a source synchronous interface for a receiver module, comprising: configuring first configurable logic to provide a first input cell with a first delay chain and a first register block for receipt of a forwarded clock signal by the first delay chain; configuring second configurable logic to provide a second input cell with a second delay chain and a second register block for receipt of a data signal by the second delay chain, the data signal being associated with the forwarded clock signal, the second input cell configured such that output from the second delay chain is coupled to a data input of the second register block; and operating the first input cell and the second input cell in one of a first modality and a second modality.

Another aspect of the invention is a source synchronous interface for a receiver module, comprising: a first input cell including a first delay chain and a first register block, the first input cell coupled to receive a forwarded clock signal; a second input cell including a second delay chain and a second register block, the second input cell coupled to receive a data signal associated with the forwarded clock signal, output from the second delay chain coupled to a data input of the second register block.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIGS. 2A, 2B and 2C are respective signal diagrams of exemplary embodiments of DQ signal and DQS signal.

DETAILED DESCRIPTION OF THE DRAWINGS

Figure 1:
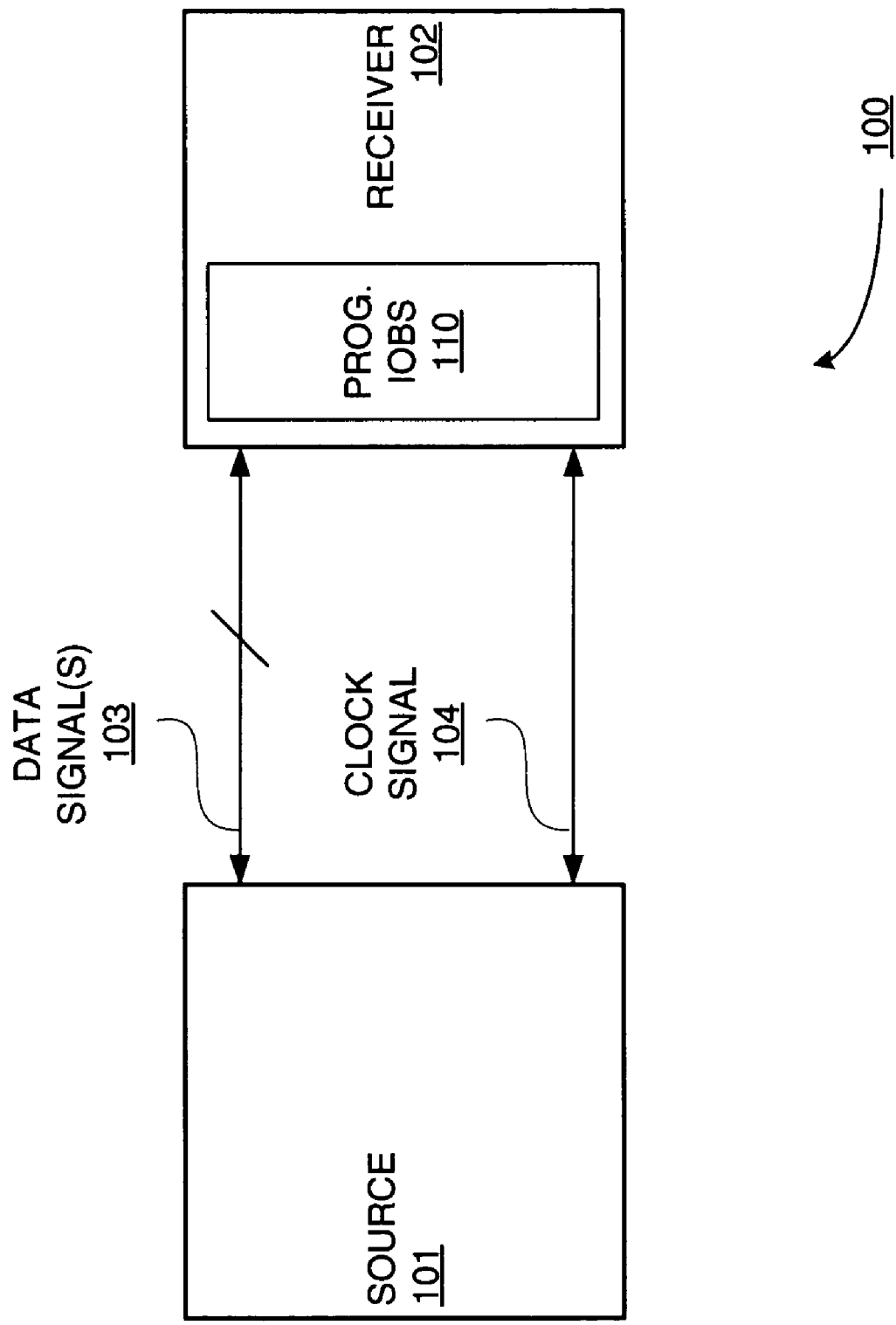
FIG. 1 is a block diagram depicting an exemplary embodiment of a source synchronous interface.

FIG. 1 is a block diagram depicting an exemplary embodiment of a source synchronous interface 100. Source 101 outputs one or more data signals 103 and a forwarded clock signal 104 for receipt by receiver 102. Data is provided to the receiver in serial, though due to the accompanying forwarded clock signal the interface is a parallel interface. However, multiple serial data signals 103, namely, multiple data lines, may be used. For example, there may be two data lines and thus two serial data signals 103 for each forwarded clock signal 104. For a memory interface, such as double data rate ("DDR") synchronous dynamic random access memory ("SDRAM") interface, bidirectional signaling is used, where data signals 103 are conventionally referred to as "DQ"s, and where forwarded clock signal 104 is conventionally referred to as "DQS". The "D" represents that data is driven into source 101; the "Q" represents that data is driven out of source 101; and the "S" indicates a strobe pin or signal. Notably, a source synchronous single data rate ("SDR") SDRAM may be used. Furthermore, any known source synchronous interface may be used, as will become more apparent. For clarity by way of example, it will be assumed that a DDR SDRAM interface with data provided in bidirectional signaling is used, though other source synchronous interfaces may be used. For example, generally for networking and telecommunications applications, unidirectional signaling is used. Additionally, receiver 102 may include configurable logic which may be in the form of two or more input/output blocks ("IOBs") 110 which may be programmable. Notably, conventional quad data rate ("QDR") SRAMs, which use unidirectional signaling, may be used where each IOB is used either for incoming or outgoing traffic.

FIGS. 2A and 2B are respective signal diagrams of exemplary embodiments of DQ signal 203 and DQS signal 204. FIG. 2C is a respective signal diagram of an exemplary embodiment of DQS signal 204 and receiver clock signal ("OCLK") 205.

In FIG. 2A, DQ signal 203 and DQS signal 204 are edge and phase aligned when exiting DDR SDRAM 201. However, as illustratively shown in FIG. 2B, in a receiver, DQS signal 204 is phase-shifted ninety degrees (90°) from DQ signal 203 to allow DQS signal 204 to be used as a clock to register data of DQ signal 203. FIG. 2C illustratively shows that during propagation from a source to a receiver, DQS signal 204 and receiver clock, OCLK signal 205, may have an unknown phase relationship 210 though they are typically approximately the same frequency. For example, for DDR SDRAMs, the frequency is conventionally exactly the same and not approximate. For another example, for networking and telecommunications applications, the frequency of a forwarded clock signal 204 and a receiver clock signal 205 may or may not be of the same frequency.

Figure 3:
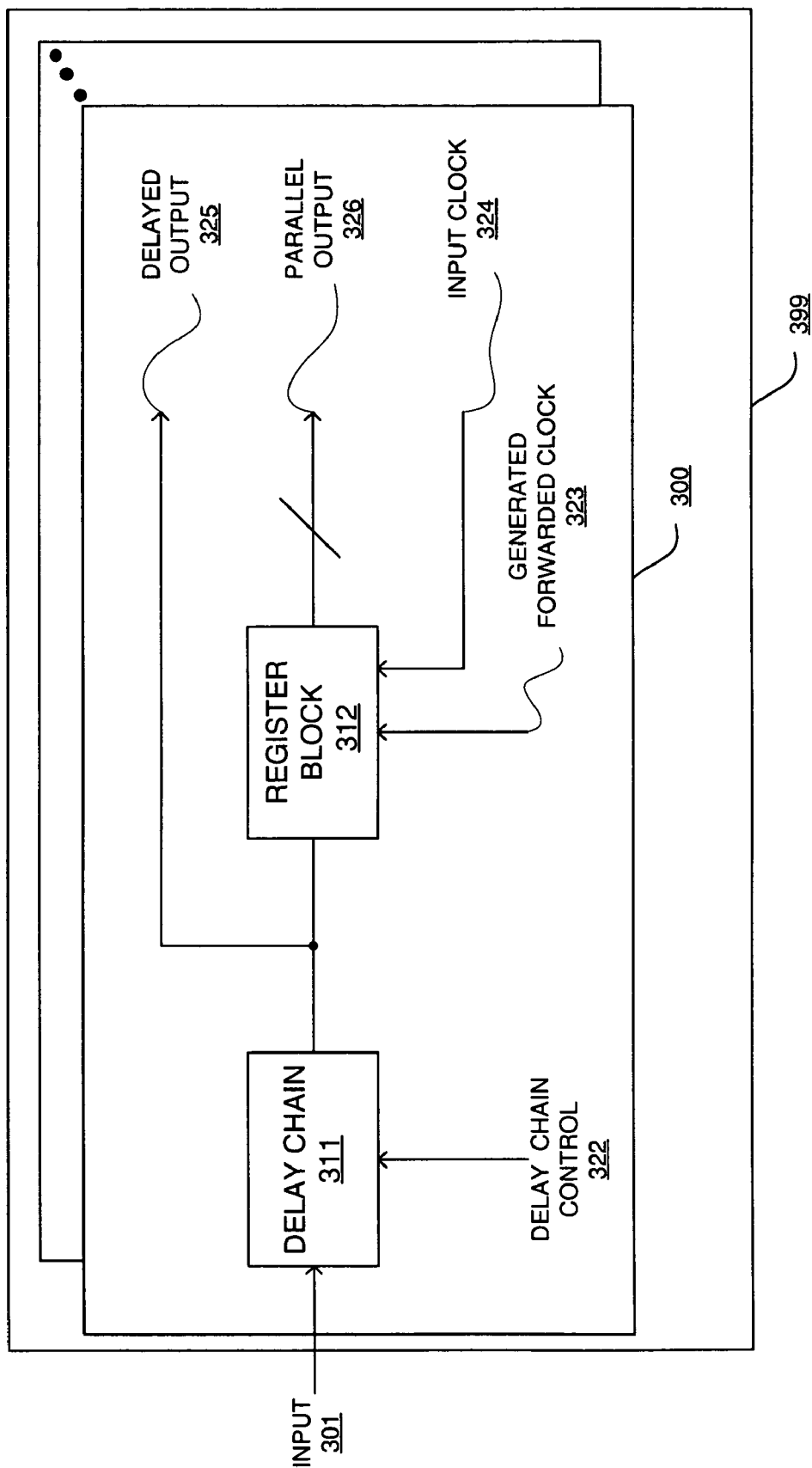
FIG. 3 is a block diagram depicting an exemplary embodiment of a receiver module.

FIG. 3 is a block diagram depicting an exemplary embodiment of a receiver module 300. Receiver module 300 includes at least two sub-modules, namely, one for data input and one for clock input. However, each data input line input may have its own sub-module. Notably, sub-modules may be essentially the same with only minor differences, if any, as no distinction need be made as between data and clock input.

Input signal 301 is provided to delay chain 311. Additional details regarding a voltage-controlled delay chain that may be used for delay chain 311 may be found in a co-pending U.S. patent application entitled "Voltage-controlled Delay Element" by Zhang et al., filed Jul. 12, 2004, which is incorporated by reference herein in its entirety.

The amount of delay of input signal 301 provided by delay chain 311 is controllable via delay chain control signal 322. Alternatively, a preprogrammed value or a combination of a preprogrammed value and a controlled delay chain input may be used to provide a controllable delay. The preprogrammed value may be equal to the inverse value of 4*f*di (i.e., 1/(4&f&di)), where f is frequency of the data and di is the amount of delay equal to one element of delay. This provides a 90 degree phase shift between clock and data signals.

Output of delay chain 311 is a delayed version of input signal 301, namely, delayed output signal 325, which may be an output of receiver module 300. Output of delay chain 311 is input to register block 312. Data may be output from register block 312 in parallel, namely, parallel output signals 326, in partial response to delayed output signal 325.

Register block 312 includes a plurality of registers. Register block 312 includes two clock inputs, namely, one clock input for a generated forwarded clock signal 323 and one clock input for an input clock signal 324 ("OCLK"). Generated forwarded clock signal 323 is the same frequency as a forwarded clock signal. Input clock signal 324 is either the same signal in frequency and phase as generated forwarded clock signal 323 or the same signal in frequency, though different phase, as generated forwarded clock signal 323. For some networking interfaces, including computer networks and telecommunication interfaces, input clock signal 324 may have the same frequency and phase as generated forwarded clock signal 323. However, for other networking interfaces and for memory interfaces, input clock signal 324 may have the same frequency, though a different phase, as generated forwarded clock signal 323.

Receiver module 300 may be part of an integrated circuit. In particular, receiver module 300 may be part of a programmable logic device 399. Programmable logic devices ("PLDs") exist as a well-known type of integrated circuit ("IC") that may be programmed by a user to perform specified functions. There are different types of programmable logic devices, such as programmable logic arrays ("PLAs") and complex programmable logic devices ("CPLDs"). One type of programmable logic device, called a field programmable gate array ("FPGA"), is very popular because of a superior combination of capacity, flexibility, time-to-market, and cost.

An FPGA typically includes an array of configurable logic blocks ("CLBs") and programmable input/output blocks ("IOBs"). The CLBs and IOBs are interconnected by a programmable interconnect structure. The CLBS, IOBS, and interconnect structure are typically programmed by loading a stream of configuration data ("bitstream") into internal configuration memory cells that define how the CLBS, IOBS, and interconnect structure are configured. FPGAs may also contain other types of known circuitry.

There are conventionally many IOBs in an FPGA, at least a portion of which may be configured as a respective receiver module 300. Accordingly, as described herein, IOBs may be configured either for synchronous memory interface or network interface, and then subsequently reconfigured for either of these two types of interfaces. This bimodality provides greater interface flexibility with limited circuitry overhead.

Figure 4:
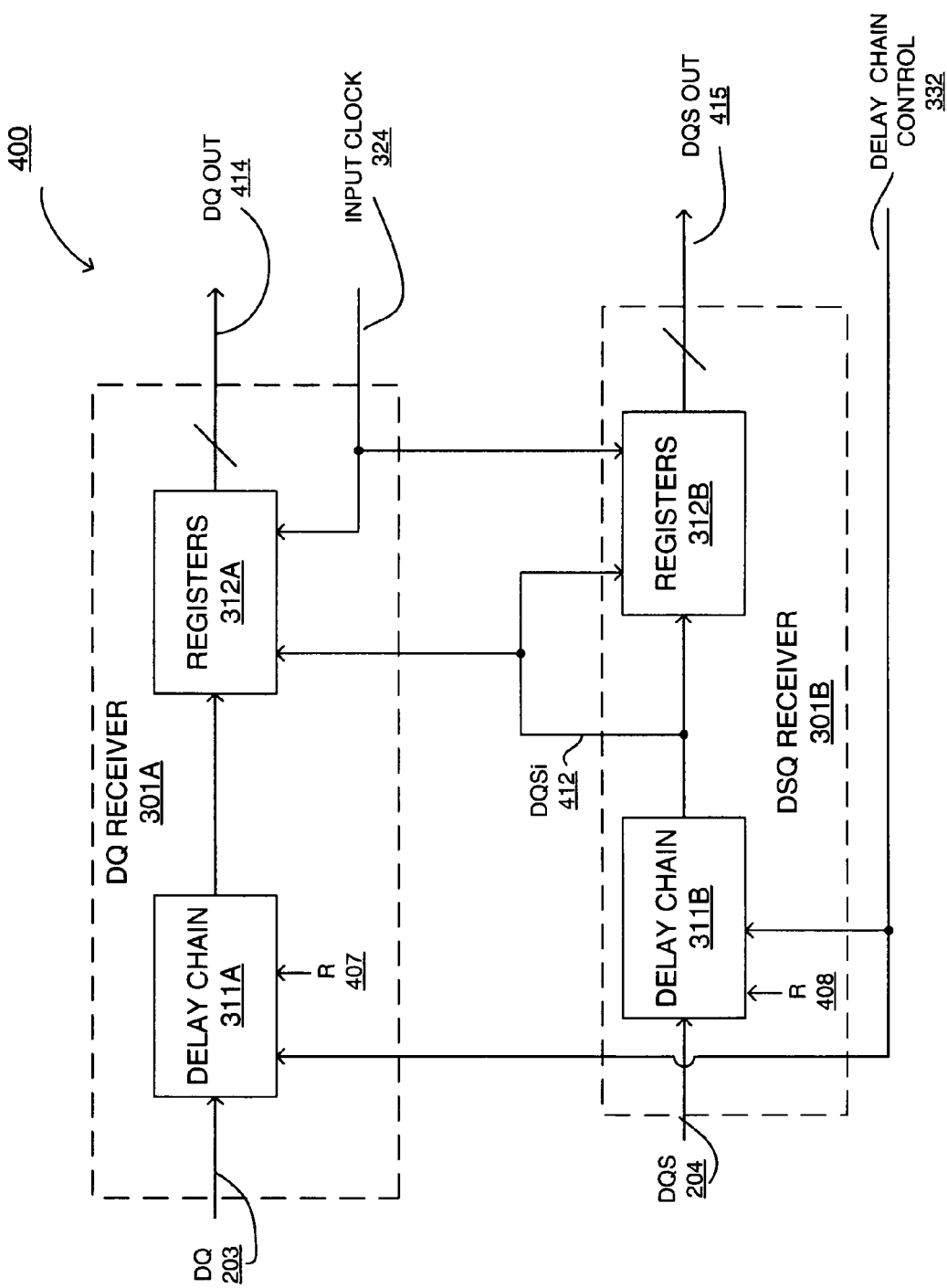
FIG. 4 is a block diagram depicting an exemplary embodiment of a receiver module for a synchronous memory interface.

FIG. 4 is a block diagram depicting an exemplary embodiment of a receiver module 400 for a synchronous memory interface. Receiver module 400 is similar to receiver module 300 of FIG. 3, and accordingly some common description is not repeated.

Receiver module 400 includes sub-modules, namely, DQ receiver 301A and DQS receiver 301B. Again, though only one data signal, namely DQ signal 203, is illustratively shown, more than one data input signal may be used where there is a separate DQ receiver sub-module for each such data input signal. Additionally, DQSi signal 412 may be provided as a clock signal to other DQ receiver sub-modules.

DQ signal 203 is provided as an input to delay chain 311A. DQS signal 204 is provided as an input to delay chain 311B. Delay chain control signal 332 is provided as input to delay chains 311A and 311B to incrementally control the amount of delay imposed. Initially, delay chains 311A and 311B are set or reset to have DQS signal 204 lag DQ signal 203. For example, reset signal 407 may be used to set delay chain 311A to approximately no initial delay, e.g. 0° phase adjustment, and reset signal 408 may be used to set delay chain 311B to delay DQS signal 204 to produce a phase shift between DQ signal 203 and DQS signal 204. For example, approximately ninety degree (90°) phase shift may be used. However, a phase adjustment other than ninety degrees may be used. Alternatively, delay chains 311A and 311B may achieve a preliminary value of delay using programmable elements, and thus use of set and reset signals as described earlier in this paragraph may be avoided. Moreover, reset lines for reset signals 407 and 408 may be tied together. In any of these embodiments, it should be appreciated that a forwarded clock signal and a receiver clock signal are to be phase aligned to ensure proper association of received data to clocking.

After initial delay settings, DQS signal 204 and DQ signal 203 are incrementally adjusted to increase or decrease the delay by the same amount each time. This incremented-stepwise adjustment is done via delay chain control signal 332, which is input to both delay chain 311A and delay chain 311B.

Output of delay chain 311A is provided as data input to registers 312A, and output of delay chain 311B is provided as data input to registers 312B. Output from delay chain 311B, namely, DQSi signal 412, is provided as a clock input to registers 312A and 312B. Thus, DQSi is both a clock and data input for registers 312B. Another clock input to registers 312A and 312B is receiver internal input clock signal 324. For a synchronous memory interface, receiver input clock signal 324 has the same frequency as DQSi signal 412. However, the phase relationship between DQSi signal 412 and receiver input clock signal 324 is difficult to compute accurately and, even if computed, the result generally has too much variance for high-speed operation as previously described. Output from registers 312A is DQ output signals 414, and output from registers 312B is DQS output signals 415. Output signals 414 and 415 are parallel outputs, as described below in additional detail.

Figure 5:
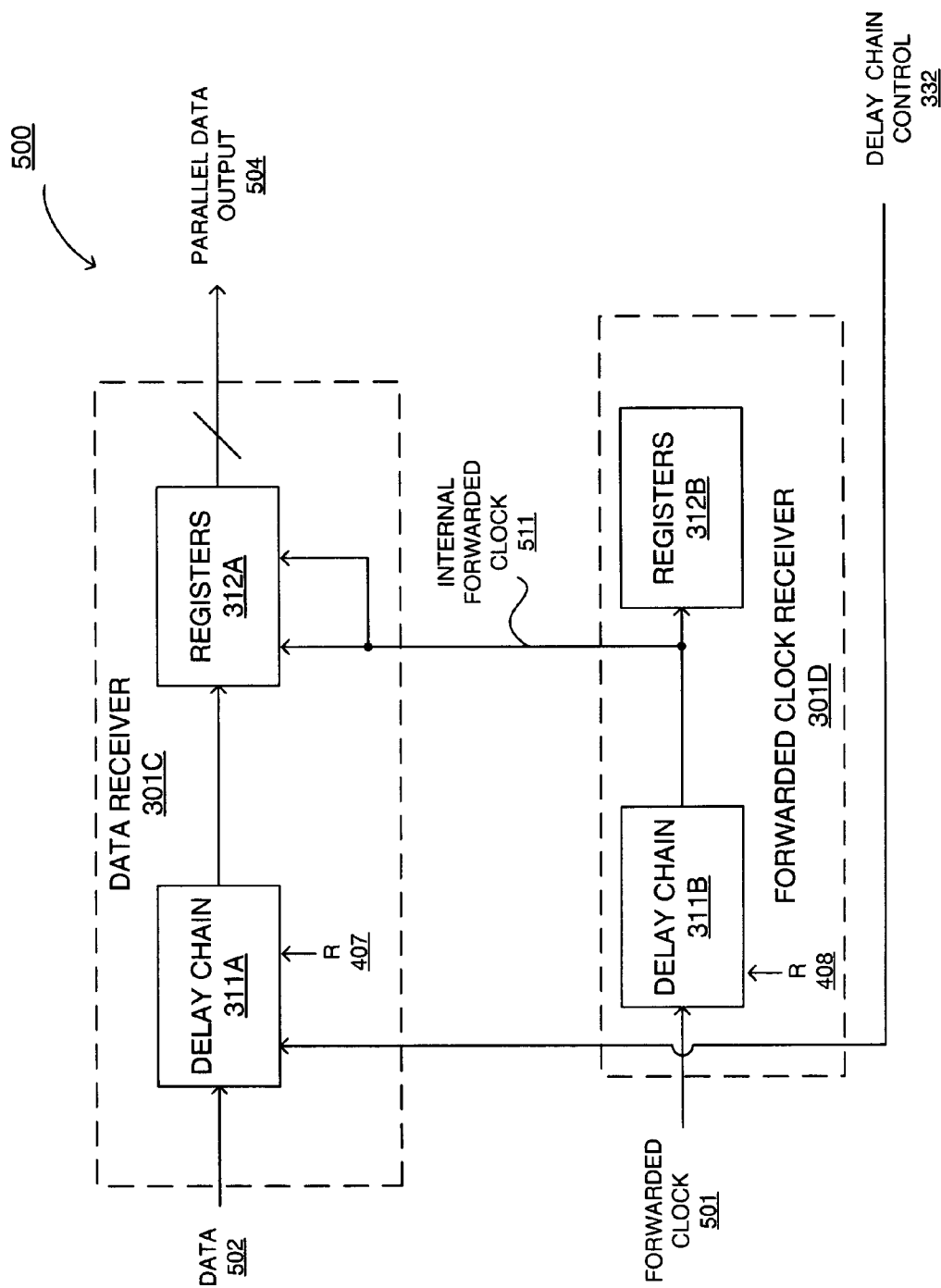
FIG. 5 is a block diagram depicting an exemplary embodiment of a receiver module for a synchronous network/telecommunication interface.

FIG. 5 is a block diagram depicting an exemplary embodiment of a receiver module 500 for a synchronous network interface. Receiver module 500 is similar to receiver module 400 of FIG. 4, and accordingly common description is not repeated.

Receiver module 500 includes sub-modules, namely, data receiver 301C and forwarded clock receiver 301D. Data signal 502 may be a serial data signal which is converted to parallel data output 504.

Data signal 502 is provided as an input to delay chain 311A. Forwarded clock signal 501 is provided as an input to delay chain 311B. Delay chain control signal 332 is provided as input to delay chain 311A to control the amount of delay imposed. In an embodiment, initially delay chain 311A is set via delay chain control signal 332 to add no delay to data signal 502, and delay imposed by delay chain 311B on forwarded clock signal 501 is a fixed delay to provide approximately a 90° phase shift. For a networking/telecommunications interface, both clock and data elements are initially set to zero delay. After the initial setting, each data signal is moved for alignment to a clock signal. This is in contrast to a memory interface where the clock signal is moved for alignment with a data signal.

Output of delay chain 311A is provided as data input to registers 312A, and output of delay chain 311B is provided as data input to registers 312B. Output from delay chain 311B, namely, internal forwarded clock signal 511, is provided as a clock input to registers 312A. Additionally, as input clock signal 324 (shown in FIG. 4) is not used for this type of interface, internal forwarded clock signal 511 is provided as a clock input in its place to registers 312A. Output from registers 312A is parallel data output signals 504. Output from registers 312B is unused.

Notably, registers 312B could be omitted for a network interface. However, receiver sub-modules are configurable to be used either for a network interface or a synchronous memory interface. Notably, an IOB used as clock input port may be used as a data input port, and vise versa.

Figure 6:
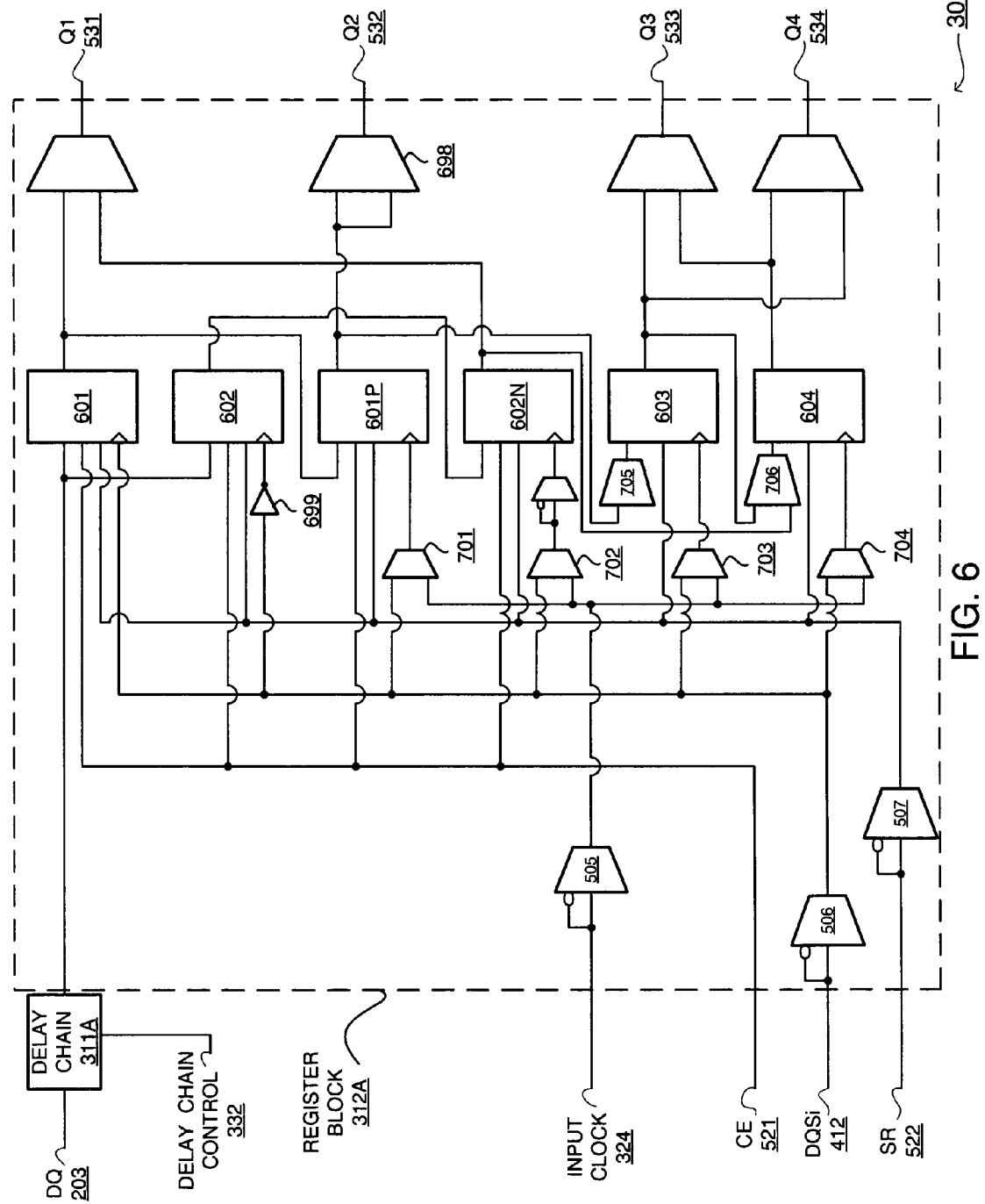
FIG. 6 is a block/schematic diagram depicting an exemplary embodiment of DQ receiver for a synchronous memory interface.
Figure 7:
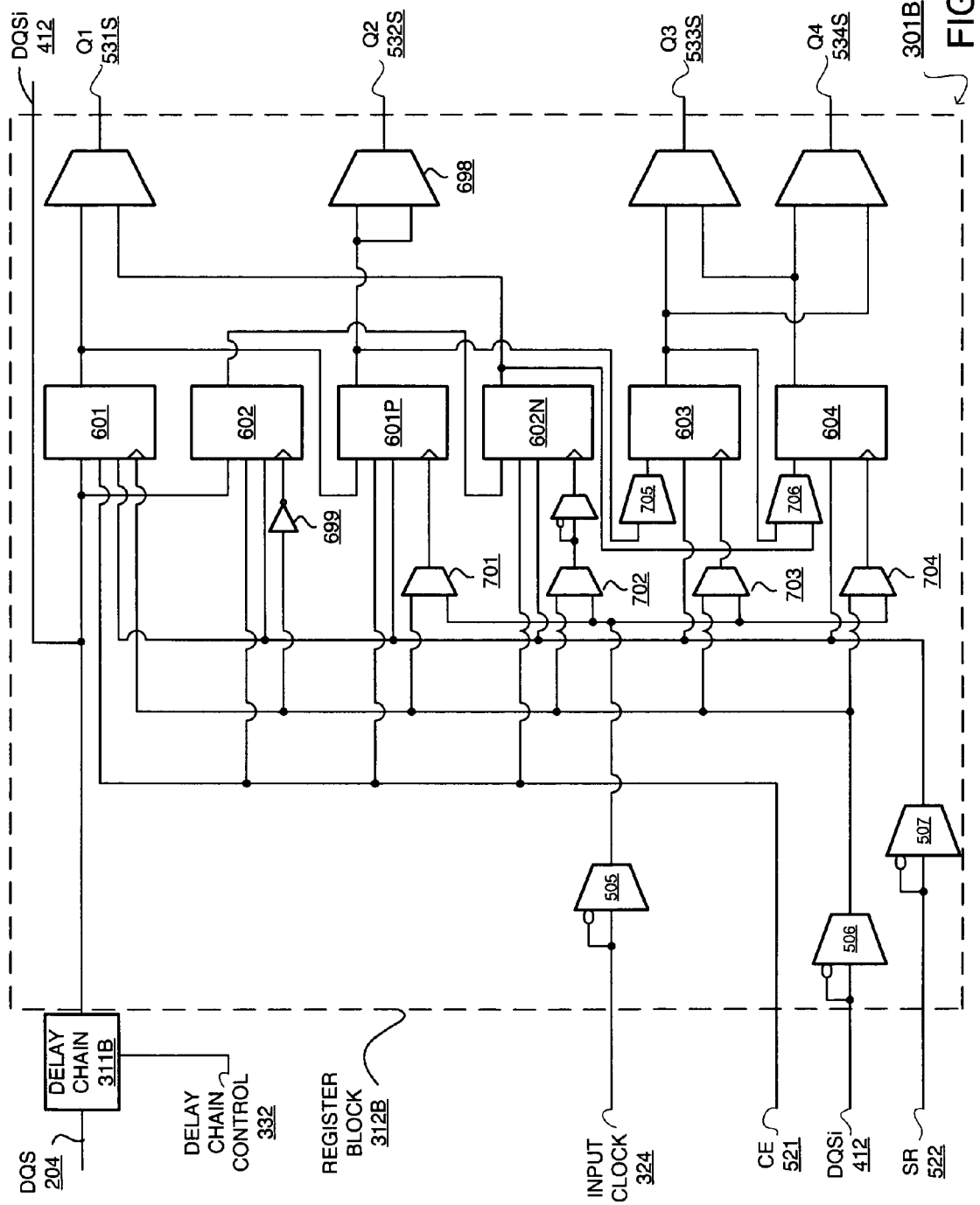
FIG. 7 is a block/schematic diagram depicting an exemplary embodiment of DQS receiver for a synchronous memory interface.

FIG. 6 is a block/schematic diagram depicting an exemplary embodiment of DQ receiver 301A for a synchronous memory interface. FIG. 7 is a block/schematic diagram depicting an exemplary embodiment of DQS receiver 301B for a synchronous memory interface. Notably, in this embodiment, receiver cells 301A and 301B are the same circuits with one exception, namely, DQSi signal 412 is an output of delay chain 311B. For purposes of clarity, FIGS. 6 and 7 are simultaneously described using same reference numbers where applicable.

Register blocks 312A and 312B include registers 601, 602, 601P, 602N, 603, and 604, multiplexers 701 through 706, inverter 699, as well as other multiplexers and inverters. Notably, "P" in register 601P indicates control via a positive edge of the clock, and "N" in register 602N indicates control via a negative edge of the clock. To allow for DDR operation, signals, as well as inverted versions thereof, may be input to multiplexers. For example, input clock signal 324, DQSi signal 412, and set/reset signal 522, and each of their respective inverted versions, are respectively input to multiplexers 505, 506, and 507. Clock enable signal 521 is provided to a clock enable port of each of flip-flops 601, 602, 601P, and 602N. DQSi signal 412 output from multiplexer 506 is an input to inverter 699 and multiplexers 701 through 704. Input clock signal 324 output from multiplexer 505 is an input to multiplexers 701 through 704. The outputs of inverter 699 and multiplexers 701 through 704 are respectively provided to clock ports of registers 602, 601P, 602N, 603, and 604. DQSi signal 412 output from multiplexer 506 is an input to a clock port of register 601. Accordingly, setting multiplexer 701 through 704 in one state means that registers 601P, 602N, 603, and 604 are clocked responsive to DQSi signal 412, and setting multiplexer 701 through 704 in another state means that registers 601P, 602N, 603, and 604 are clocked responsive to input clock signal 324.

Parallel DQ output 414 and parallel DQS output 415 (shown in FIG. 4) are each illustratively shown as four lines wide (FIGS. 6 and 7, respectively), namely, Q1 output signals 531 and 531S, Q2 output signals 532 and 532S, Q3 output signals 533 and 533S, and Q4 output signals 534 and 534S. Of course, fewer or more outputs than four may be implemented.

Inverter 699 in front of a clock port of register 602 receives and inverts DQSi signal 412 for DDR operation. For SDR operation, data from registers 602 and 602N is bypassed using multiplexers. Delay chains 311A and 311B create at least approximately a 90 degree phase difference between DQ signal 203 and DQS signal 204, as previously described.

A delayed clock signal, DQSi signal 412, is used to clock registers 601 and 602. In DQS receiver 301B, DQSi signal 412 is used as a data input to registers 601 and 602, and is used to clock register 601 and 602. DQSi signal 412 passes out of DQS receiver 301B before it can re-enter DQS receiver 301B, thereby creating a delay. The delay is created by the fact that to propagate DQSi 412 to locations in the integrated circuit takes a reasonable amount of circuitry. DQSi 412 is provided to a clock distribution area where it is joined by other possible clocks. These clock signals then pass through multiplexers and drivers that drive a number of receiver blocks. These circuits and their routing add at least a sufficient amount of delay to DQSi 412 to satisfy all timing requirements. For example, this delay is sufficient to ensure setup and hold times for registers 601 and 602 in DQS receiver 301B are met.

Receiver input clock signal 324 clocks registers 601P, 602N, 603, and 604. For DDR operation, two shift chains are created, namely, registers 601, 601P and 603 form one chain, and registers 602, 602N and 604 form the other chain. These shift chains facilitate receivers to capture serial data, convert such captured serial data to parallel data, and then drive parallel data outputs Q1 through Q4 in this exemplary embodiment. In this embodiment, register 602N drives output Q1, register 601P drives output Q2, register 603 drives output Q3, and register 604 drives output Q4. For SDR operation, a single serial shift chain is created, as described below in additional detail.

Recall, from a synchronous memory interface, a forwarded clock, DQS, will have the same clock frequency as an internal clock of an integrated circuit in which receiver sub-module is located. To establish a phase relationship between receiver input clock signal 324 and DQS signal 204, outputs Q1 through Q4 of DQS receiver 301B are used. Notably, phase relationship may be established at the DQS receiver owing to the initial adjustment and moving delay chains together ensures that the DQ's are in the proper alignment.

Because DQS signal 204 is a clock signal, a repeating pattern, such as a repeating pattern of 1-0-1-0, is input into registers 601 and 602 of DQS receiver 301B. If DQSi signal 412 and receiver input clock signal 324 are not phase aligned, Q1 through Q4 of DQS receiver 301B will either be a pattern of 0-1-0-1 or 1-0-1-0. If DQSi signal 412 and receiver input clock signal 324 are phase aligned, Q1 through Q4 of DQS receiver 301B will either be a pattern of 0-1-0-1 or 1-0-1-0 or something else.

Figure 8:
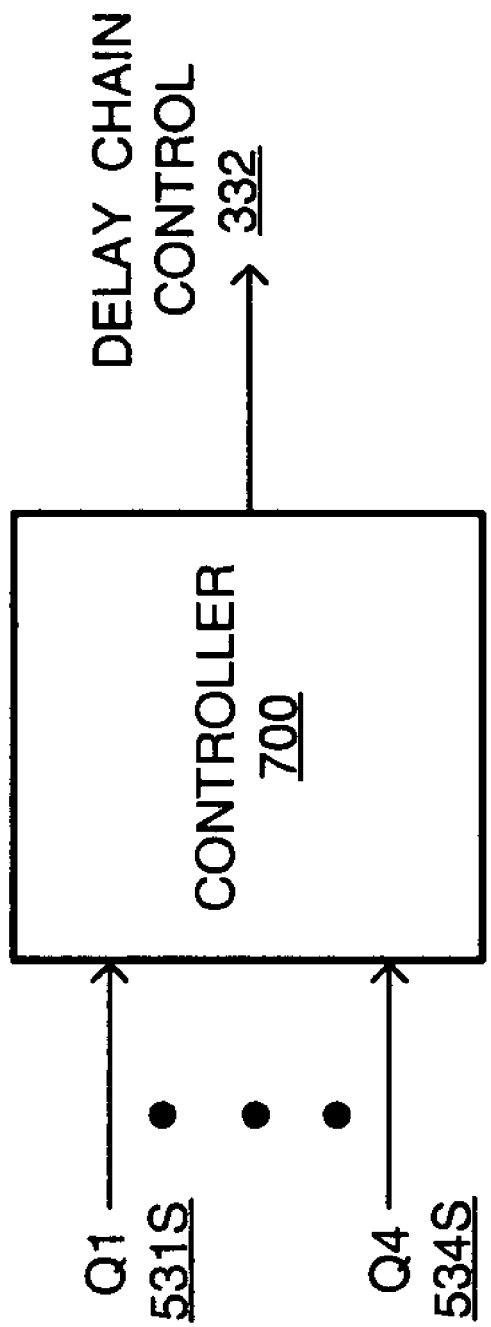
FIG. 8 is a block diagram of an exemplary embodiment of inputs and an output to a controller.

FIG. 8 is a block diagram of an exemplary embodiment of inputs and an output to a controller 700. Notably, controller 700 may be configured or implemented using configurable logic of a PLD.

Once controller 700 determines an input pattern from output signals 531S through 534S, the value of delay is incrementally increased by delay chain control signal 332. Notably, delay chain control signal 332 is for delay chain 311A of DQ receiver 301A and delay chain 311B of DQS receiver 301B. Delay is incrementally increased, or decreased, until controller 700 determines a difference in input pattern from output signals 531S through 534S. A change in such pattern means that receiver input clock signal 324 and DQSi signal 412 are phase aligned. From this delay where receiver input clock signal 324 and DQSi signal 412 are coincident, delay is incremented or decremented via delay chains 311A and 311B responsive to delay chain control signal 332 to an amount sufficient to separate DQSi signal 412 from receiver input clock signal 324 to ensure against coincidence.

This separation may be done to ensure against variations, for example due to semiconductor process, temperature or voltage effects of either or both an memory device or PLD. By having delay chain controls for receivers tied together, shifts in delay for all such tied receivers are the same to ensure phase separation is maintained.

Notably, in FIGS. 6 and 7, if a network interface, instead of a synchronous memory interface, is formed, then a forwarded clock, such as DQSi in FIG. 7, is used to clock registers 601, 602, 601P, 602N, 603, and 604, and receiver input clock signal 324 is unused because of a change in settings of multiplexers 701 through 704. For a network interface with an SDR signal, a serial shift chain using registers 601, 601P, 603, and 604 is created. Notably, inputs to multiplexer 698, from which output Q2 is obtained, are the same signal, generally referred to as a "shorted" input. This type of input may be used to create equal path lengths to equate delays for Q1, Q2, Q3, and Q4. Additionally, for network interfacing, a FIFO buffer (not shown) may be added for clocking in Q1 through Q4 responsive to a clock domain of a forwarded clock, namely, DQSi signal 412, and clocking out from the FIFO buffer using a clock signal of another domain of a host integrated circuit. Because there is no guarantee that DQSi signal 412 is equal in frequency to a clock signal of the receiver of the host integrated circuit, a FIFO buffer may be added as is known. For a PLD host integrated circuit, the FIFO buffer may be instantiated using CLBs, block memories or RAMs, or other resources.

Figure 9:
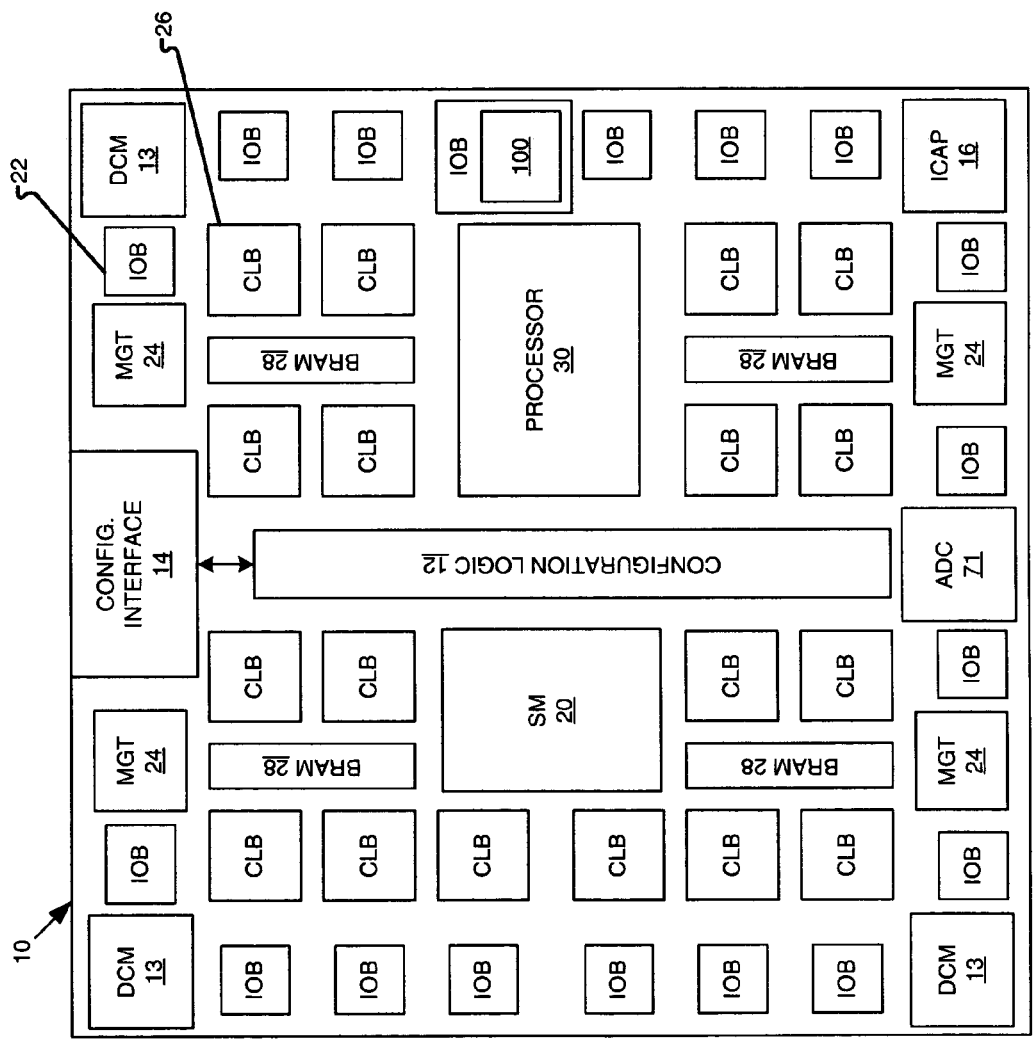
FIG. 9 is a high-level block diagram depicting an exemplary embodiment of a Field Programmable Gate Array ("FPGA").

FIG. 9 is a high-level block diagram depicting an exemplary embodiment of a Field Programmable Gate Array ("FPGA") 10. FPGA 10 is an example of a configurable integrated circuit. However, other programmable devices such as programmable logic devices ("PLDs") other than FPGAs, including complex PLDs ("CPLDs"), and other integrated circuits with configurable logic, may be used.

FPGA 10 may include various resources such as configurable logic blocks ("CLBs") 26, programmable input/output blocks ("IOBs") 22, memory, such as block random access memory 28, delay lock loops (DLLs) and multiply/divide/de-skew clock circuits which collectively provide digital clock managers ("DCMs") 13, and multi-gigabit transceivers ("MGTs") 24. An external memory may be coupled to FPGA 10 to store and provide a configuration bitstream to configure FPGA 10, namely, to program one or more configuration memory cells to configure CLBs 26, IOBs 22, and other resources. Notably, IOBs 22, as well as MGTs 24, may be disposed in a ring or ring-like architecture forming a perimeter of I/Os around CLBs 26 of FPGA 10 in some embodiments, although other configurations are possible.

Additionally, FPGA 10 may include other features such as an Internal Configuration Access Port ("ICAP") 16, an embedded processor 30, an embedded system monitor 20 with an Analog-to-Digital Converter ("ADC"), and an embedded second ADC 40. Though FPGA 10 is illustratively shown with a single embedded processor 30, FPGA 10 may include more than one processor 30. Additionally, known support circuitry for interfacing with embedded processor 30 may be included in FPGA 10. Furthermore, rather than an embedded processor 30, processor 30 may be programmed into configurable logic such as a "soft" processor 30.

Although FIG. 9 illustratively shows a relatively small number of IOBs 22, CLBs 26 and BRAMs 28, for purposes of example, it should be understood that an FPGA 10 conventionally includes many more of these elements. Additionally, FPGA 10 includes other elements, such as a programmable interconnect structure and a configuration memory array, which are not illustratively shown in FIG. 9.

FPGA 10 is configured in response to a configuration information (commands and data) bitstream, which is loaded into a configuration memory array of FPGA 10 from an external memory, e.g., a read-only memory ("ROM"), via configuration interface 14 and configuration logic 12. Configuration interface 14 can be, for example, a select map interface, a Joint Test Action Group ("JTAG") interface, or a master serial interface. Alternatively, with respect to external configuration or reconfiguration, FPGA 10 may be internally reconfigured through use of ICAP 16 or a dynamic reconfiguration port. A dynamic reconfiguration port is described in additional detail in a co-pending U.S. patent application Ser. No. 10/837,331, entitled "Reconfiguration Port for Dynamic Reconfiguration", by Vadi et al., filed Apr. 30, 2004, which is incorporated by reference herein in its entirety.

With renewed reference to FIG. 9, configuration memory may include columns of memory cells, where each column includes a plurality of bits. Configuration data is conventionally divided out into data frames. Configuration data may be loaded into the configuration memory array one frame at a time via configuration interface 14 or ICAP 16, or in sub-frame increments via a dynamic reconfiguration port.

Figure 10A:
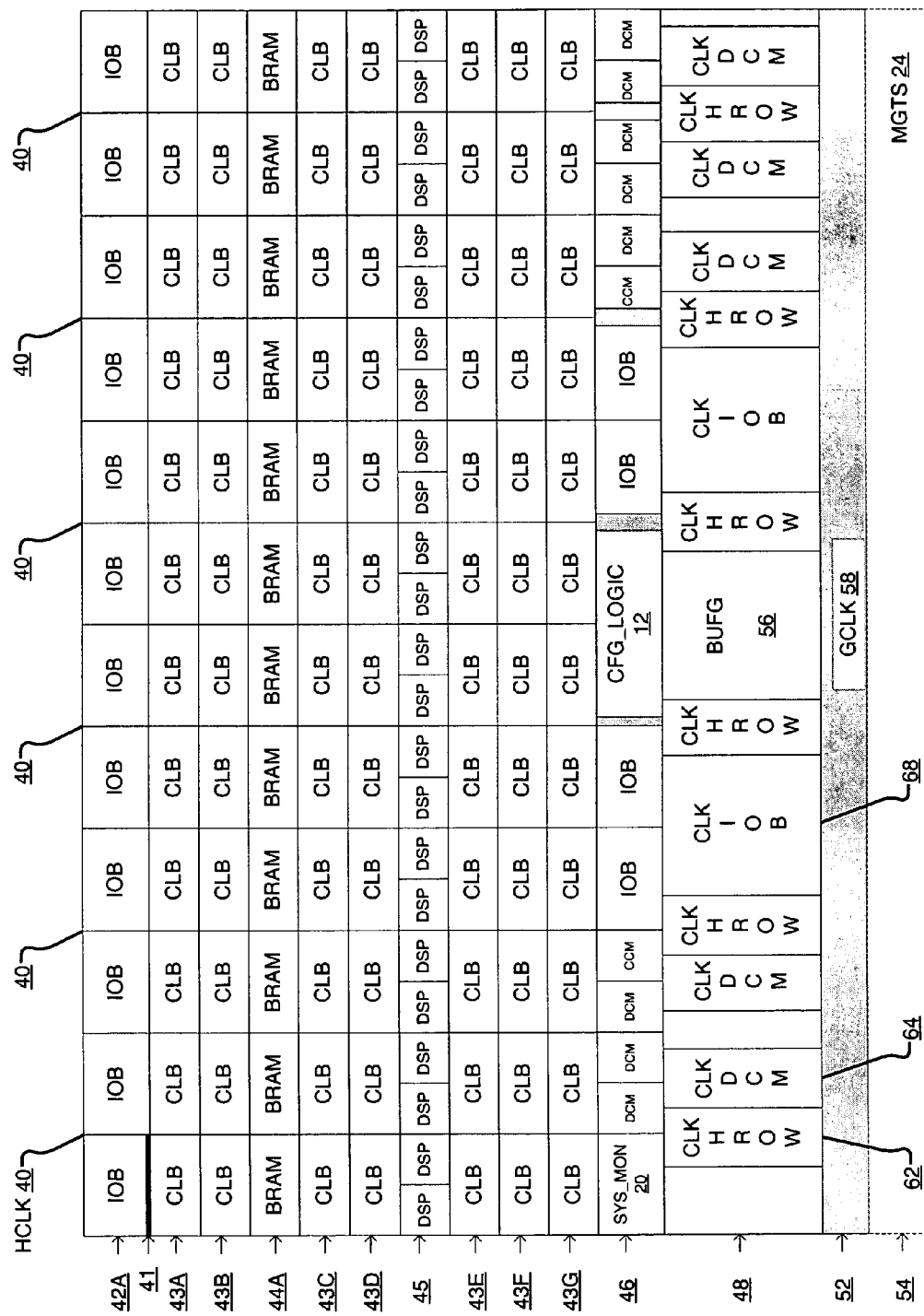
FIGS. 10A and 10B are high-level block diagrams depicting an exemplary embodiment of an FPGA with a "columnar" architecture.
Figure 10B:
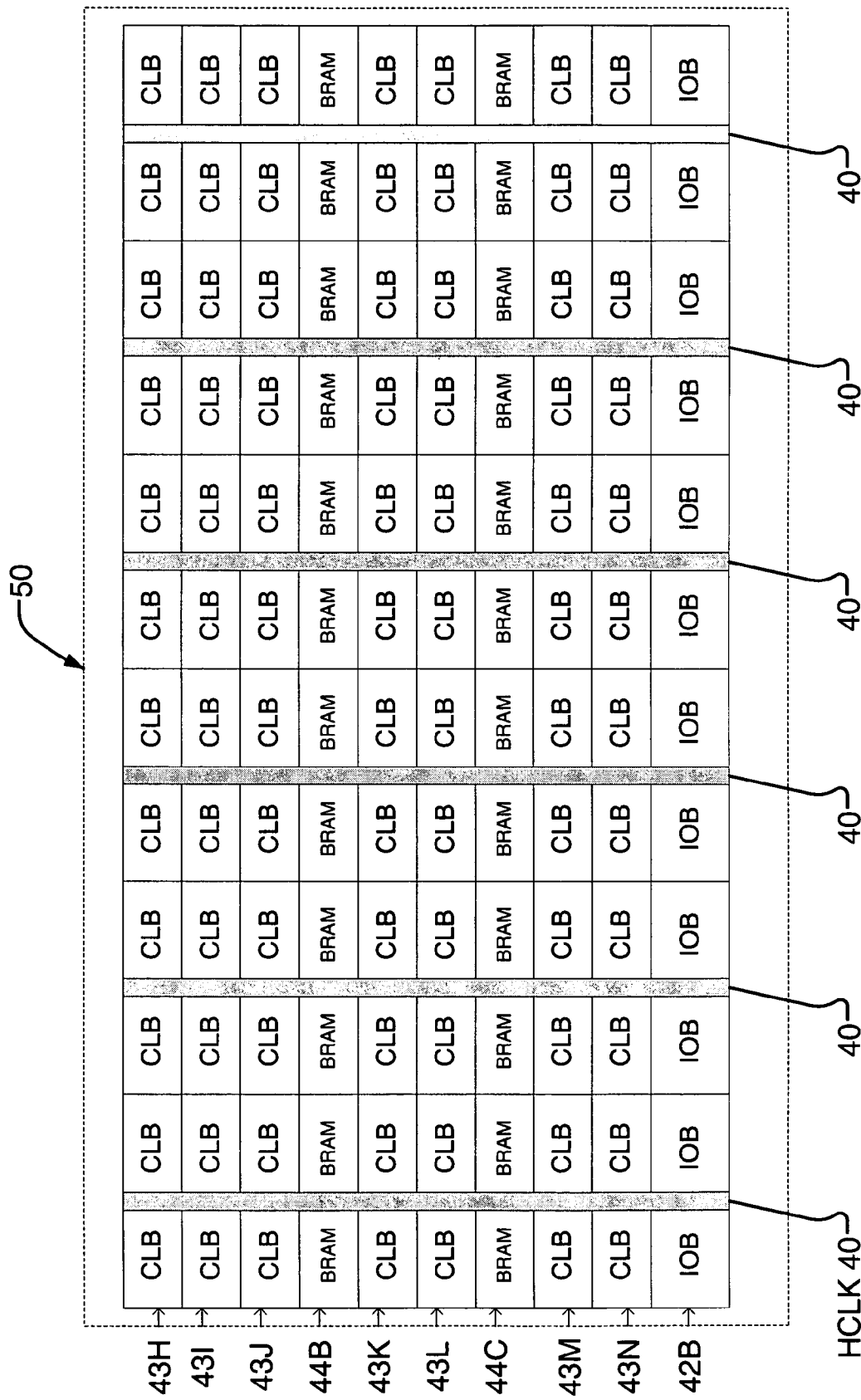

FIGS. 10A and 10B are high-level block diagrams depicting an exemplary embodiment of an FPGA 50 with a "columnar" architecture. FIG. 10A illustratively shows a top portion of FPGA 50, and FIG. 10B is the bottom portion of FPGA 50.

Figure 10C:
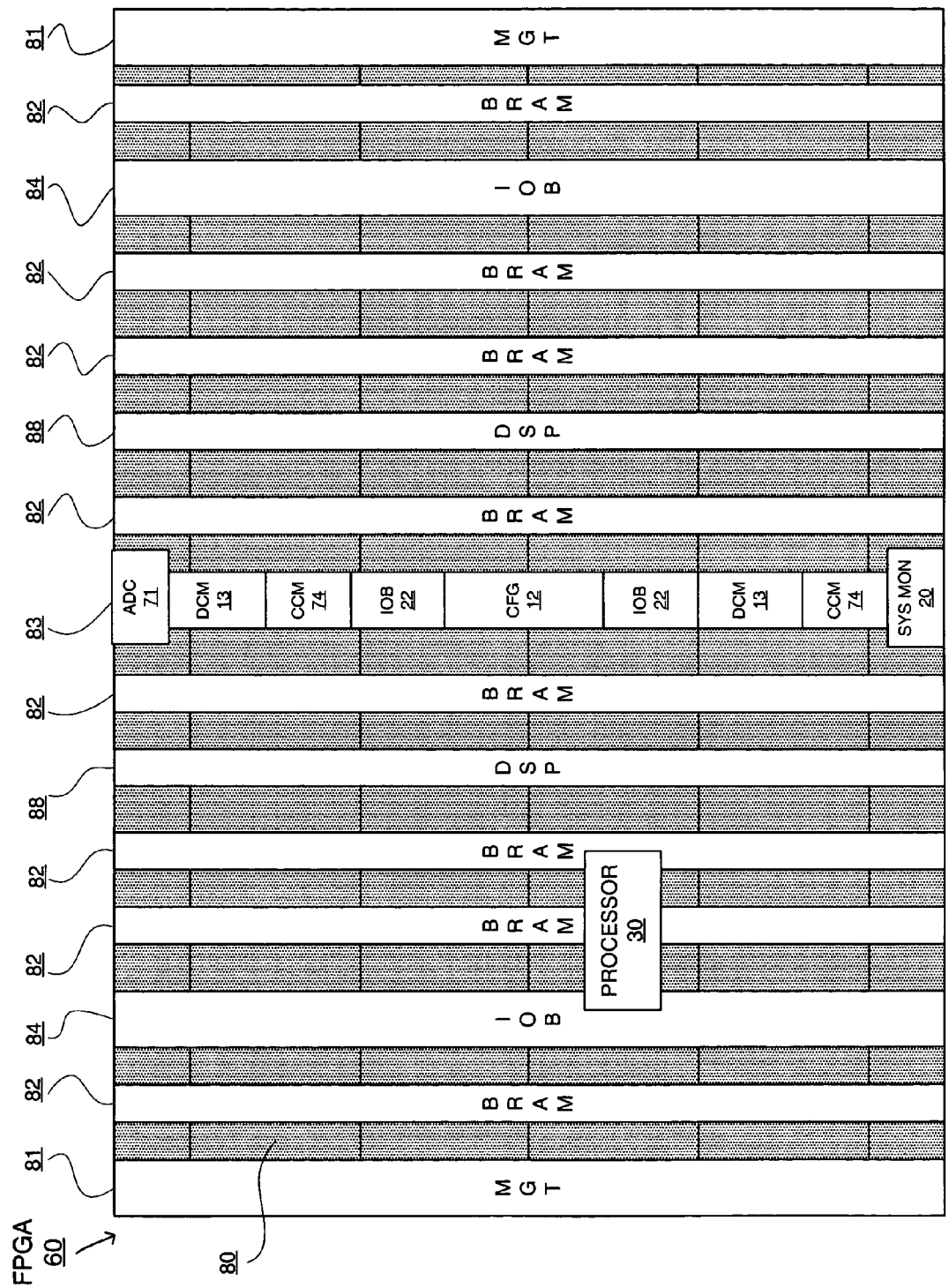
FIG. 10C is a high-level block diagram depicting another exemplary embodiment of an FPGA with a "columnar" architecture and with an embedded processor.

FIG. 10C is a high-level block diagram depicting another exemplary embodiment of an FPGA 60 with a "columnar" architecture and with an embedded processor 30. A column of MGTs 81 may be disposed on opposite sides of FPGA 60. Programmable fabric 80, which may include CLBs and programmable interconnects, may be used to respectively couple columns of MGTs 81 to columns of BRAMs 82. Programmable fabric 80 may be used to couple columns of BRAMs 82 to one another and to columns of IOBs 84. This inward progression on two opposing sides of FGPA 60 of coupling columns may continue until a center or central column 83 is reached.

Center column 83 may be coupled to columns of BRAMs 82 via programmable fabric 80. Center column 83 may include function logic blocks. Function logic blocks may, for example, include a system monitor 20 ("SYS MON"), digital clock managers 13 ("DCMs"), clock companion modules 74 ("CCMs"), configuration logic 12 ("CFG"), and IOBs 22, among other function logic blocks. Notably, not all function blocks have to be located in center column 83. For example, Digital Signal Processors ("DSPs") may be instantiated in columns of DSPs 88, which are coupled to columns of BRAMS 82 via programmable fabric 80. Alternatively, one or more DSPs may be included in center column 83.

System monitor 20 may include an analog-to-digital converter ("ADC") to monitor parameters like temperature and voltage both internally ("on-chip") and externally ("off-chip") with respect to FPGA 60. Another ADC 71 may be instantiated in center column 83 of FPGA 60 to monitor additional external analog channels. A DCM 13 may include circuits to perform clock de-skew, clock phase shifting, clock frequency synthesis, and other clock features. A CCM 74 may include circuits for phase-matched binary clock division and internal clock jitter and skew measurement.

Configuration logic 12 includes logic used to address and load configuration information into configuration memory cells, such as SRAM-based configuration memory cells, during external configuration of FPGA 60. Configuration logic 12 may include configuration registers, boundary scan test circuitry, such as JTAG circuitry, and encryption or decryption circuitry used to encrypt or decrypt bitstreams of configuration data loaded into or read out of FPGA 60.

Additional details regarding FPGA 60 may be found in a co-pending U.S. patent application Ser. No. 10/683,944 entitled "*Columnar Architecture*", by Young, filed Oct. 10, 2003, assigned to the same assignee, which is incorporated by reference herein in its entirety.

FIGS. 10A and 10B in combination provides a more detailed block diagram of an FPGA 50 having a columnar architecture, though columns have been transposed for rows. The word "tile" as used herein is an area comprising a) circuitry with one or more programmable functions, including memory, or fixed non-programmable circuitry, and b) programmable interconnections.

CLB tiles 43 are laid out in a two-dimensional array. In this example, each CLB tile 43 includes a portion of a programmable interconnect structure such that at least part of the programmable interconnect structure for FPGA 50 is formed by the various portions of the many CLBs when CLB tiles 43 are formed together for FPGA 50. Also illustrated are block random memory/multiplier (BRAM/Multiplier) tiles 44.

In order to provide input/output circuitry for interfacing FPGA 50 to external logic, IOB tiles 42 are provided along two outermost rows (e.g., top and bottom rows) of FPGA 50. In this particular example, an input/output interconnect tile (IOI tile) is used to couple an IOB tile to a CLB tile. Reference numeral 41 points to one such IOI tile. IOI tile 41 is disposed between an IOB tile 42 and a CLB tile 43.

Digital Signal Processors ("DSPs") are placed in tile area 45. A generally central tile area 46 may be used for support circuitry. The support circuitry may include, for example, DCMs, CCMs, IOBs, configuration logic 12, encryption/decryption logic, global clock driver circuitry, boundary scan circuitry and system monitor 20.

In this particular example, clock distribution circuitry is located in tile areas 48 and 52. Tile area 48 is for DCM clock distribution 64, IOB clock distribution 68 and H-tree row clock distribution 62, as well as FPGA "global" buffers ("BUFG") 56. Notably, H-tree clock distribution 40 may be disposed between columns of tiles. Tile area 52 is for FPGA "global" clock distribution 58. Multi-gigabit transceivers ("MGT") 24 may be located in tile area 54. Additional details regarding FPGA 50 may be found in a co-pending U.S. patent application Ser. No. 10/683,944 entitled "*Columnar Architecture*", by Young, filed Oct. 10, 2003, previously incorporated by reference herein in its entirety.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A source synchronous interface for a receiver module, comprising:
    a first input cell including a first delay chain and a first register block, the first input cell coupled to receive a forwarded clock signal;
    a second input cell including a second delay chain and a second register block, the second input cell coupled to receive a data signal associated with the forwarded clock signal, output from the second delay chain coupled to a data input of the second register block;

the first input cell coupled to the second input cell;
in a first modality,
output of the first delay chain provided as a first clock input to the first register block and the second register block and as a data input to the first register block;
a receiver local clock signal provided as a second clock input to the first register block and the second register block;
in a second modality,
the output of the first delay chain provided as the first clock input and the second clock input to the second register block;
wherein the first modality is for interfacing to a synchronous memory;
wherein the second modality is for interfacing to one of a network system and a telecommunications system; and
wherein in the second modality, the first register block is unused.

2. The source synchronous interface, according to claim 1, wherein the first register block and the second register block each comprise a chain of registers.

3. The source synchronous interface, according to claim 2, wherein the chain of registers for each of the first register block and the second register block is configurable for a Single Data Rate for the data signal.

4. The source synchronous interface, according to claim 3, wherein the chain of registers for each of the first register block and the second register block is further configurable for a Double Data Rate for the data signal.

5. The source synchronous interface, according to claim 2, wherein the chain of registers for each of the first register block and the second register block is configurable for a Double Data Rate for the data signal.

6. The source synchronous interface, according to claim 1:
wherein the first input cell comprises first configurable logic, the first configurable logic configured to provide the first delay chain and the first register block, and
wherein the second input cell comprises second configurable logic, the second configurable logic configured to provide the second delay chain and the second register block.

7. The source synchronous interface, according to claim 6, wherein the first configurable logic and the second configurable logic are from an input/output block of an integrated circuit.

8. The source synchronous interface, according to claim 7, wherein the integrated circuit is a programmable logic device.

9. The source synchronous interface, according to claim 8, wherein the programmable logic device is a Field Programmable Gate Array.

10. The source synchronous interface, according to claim 1, wherein in the first modality, a first reset signal is supplied to the first delay chain, and a second reset signal is supplied to the second delay chain.

11. The source synchronous interface, according to claim 10, wherein the first reset signal and the second reset signal are to provide a phase difference between the data signal and the forwarded clock signal.

12. The source synchronous interface, according to claim 11, wherein the phase difference is approximately ninety degrees.

13. The source synchronous interface, according to claim 10, wherein delays respectively imposed by the first delay chain and the second delay chain are lock-stepwise incrementally adjustable responsive to a delay chain control signal.

14. The source synchronous interface, according to claim 1, wherein in the second modality, delay imposed by the second delay chain is incrementally adjustable responsive to a delay chain control signal.

15. The source synchronous interface, according to claim 1, wherein the data signal is a first data signal, the source synchronous interface further comprising:
a third input cell including a third delay chain and a third register block, the third input cell coupled to receive a second data signal associated with the forwarded clock signal, output from the third delay chain coupled to a data input of the third register block;
in the first modality,
the output of the first delay chain provided as a first clock input to the third register block;
the receiver local clock signal provided as a second clock input to the third register block;
in a second modality,
the output of the first delay chain provided as the first clock input and the second clock input to the third register block.

16. A source synchronous system, comprising:
a source for providing at least one data signal and a data clock signal;
a receiver coupled to receive the at least one data signal and the data clock signal, the receiver configurable for a first modality and a second modality, the receiver including:
a first input cell including first configurable logic, the first configurable logic configured to provide a first delay chain and a first register block, the first input cell coupled to receive a forwarded clock signal;
a second input cell including second configurable logic, the second configurable logic configured to provide a second delay chain and a second register block, the second input cell coupled to receive a data signal associated with the forwarded clock signal, output from the second delay chain coupled to a data input of the second register block;
the first input cell coupled to the second input cell;
in the first modality,
output of the first delay chain provided as a first clock input to the first register block and the second register block and as a data input to the first register block;
a receiver local clock signal provided as a second clock input to the first register block and the second register block;
in the second modality,
the output of the first delay chain provided as the first clock input and the second clock input to the second register block;
wherein in the first modality, a first reset signal is supplied to the first delay chain, and a second reset signal is supplied to the second delay chain;
wherein the first reset signal and the second reset signal are to provide a phase difference between the data signal and the forwarded clock signal.

17. The system, according to claim 16, wherein the source is a synchronous memory.

18. The system, according to claim 17, wherein the receiver is a programmable logic device.

19. The system, according to claim 16, wherein the source is from one of a network system and a telecommunications system.

20. The system, according to claim 19, wherein the receiver is a programmable logic device.

* * * * *